United States Patent
Kimura

(10) Patent No.: US 9,235,666 B2
(45) Date of Patent: Jan. 12, 2016

(54) SIMULATION DEVICE AND SIMULATION METHOD

(75) Inventor: Tomohisa Kimura, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 906 days.

(21) Appl. No.: 13/424,225

(22) Filed: Mar. 19, 2012

(65) Prior Publication Data

US 2013/0080136 A1 Mar. 28, 2013

(30) Foreign Application Priority Data

Sep. 22, 2011 (JP) ................................. 2011-207640

(51) Int. Cl.
*G06F 17/50* (2006.01)

(52) U.S. Cl.
CPC .................................. *G06F 17/5036* (2013.01)

(58) Field of Classification Search
None
See application file for complete search history.

(56) References Cited

U.S. PATENT DOCUMENTS

| | | | | |
|---|---|---|---|---|
| 5,691,213 A * | 11/1997 | Chang | ................. | H01L 27/0266 438/275 |
| 6,591,233 B1 * | 7/2003 | Sonoda | ............................ | 703/14 |
| 7,302,378 B2 | 11/2007 | Hayashi | | |
| 7,434,179 B2 | 10/2008 | Haysshi | | |
| 7,777,999 B2 | 8/2010 | Kang et al. | | |
| 2002/0152447 A1 * | 10/2002 | Venugopal et al. | ................ | 716/4 |
| 2004/0243949 A1 * | 12/2004 | Wang et al. | ........................ | 716/4 |
| 2005/0065762 A1 | 3/2005 | Hayashi | | |
| 2005/0172246 A1 * | 8/2005 | Logie et al. | ........................ | 716/4 |
| 2008/0174924 A1 | 7/2008 | Kang et al. | | |
| 2013/0057993 A1 * | 3/2013 | Fukasaku | ............ | H01L 27/0274 361/56 |

FOREIGN PATENT DOCUMENTS

| | | |
|---|---|---|
| JP | 2000-260973 A | 9/2000 |
| JP | 2001-339052 A | 12/2001 |
| JP | 2005-093802 A | 4/2005 |
| JP | 2006-148029 A | 6/2006 |
| JP | 2006-156531 A | 6/2006 |
| JP | 2008-182239 A | 8/2008 |
| JP | 2008-204127 A | 9/2008 |
| JP | 2010-040670 A | 2/2010 |

OTHER PUBLICATIONS

Notification of Reason for Rejection, JP App No. 2011-207640, mailed Jan. 10, 2014.
K. Ise et al. "Circuit-Level Simulation of ESD Prediction for Input Protection Circuits" Trans. Inst. Electron. Inf. Commun. Eng. C (Japan), vol. 86-C, No. 6, pp. 634-642, Jun. 2003 in 9 pages.

* cited by examiner

*Primary Examiner* — Omar Fernandez Rivas
*Assistant Examiner* — Bernard E Cothran
(74) *Attorney, Agent, or Firm* — Knobbe Martens Olson & Bear LLP

(57) ABSTRACT

A simulation device having an ESD (Electro Static Discharge) protection element has a first parameter file creating unit, a second parameter file creating unit, a parameter file storage storing the parameter files created by the first and second parameter file creating units, a parameter file selector changing a parameter file to be selected from the parameter files stored in the parameter file storage, depending on whether or not operation of the ESD protection element should be verified, a netlist creating unit creating a netlist of the semiconductor circuit utilizing the parameter file selected by the parameter file selector, and a simulation executing unit verifying the operation of the semiconductor circuit based on the netlist.

18 Claims, 3 Drawing Sheets

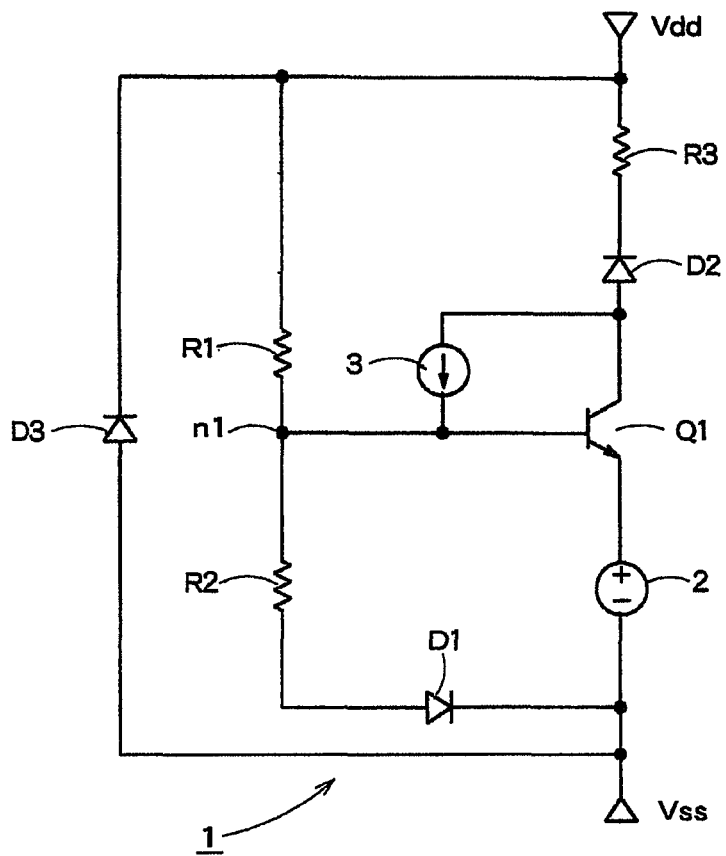
F I G. 1
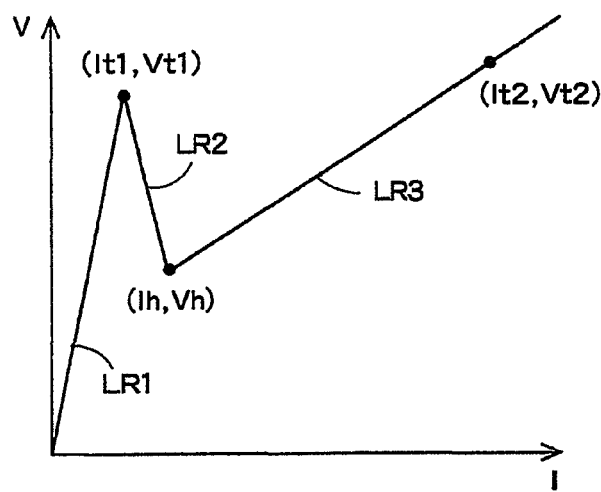
F I G. 2

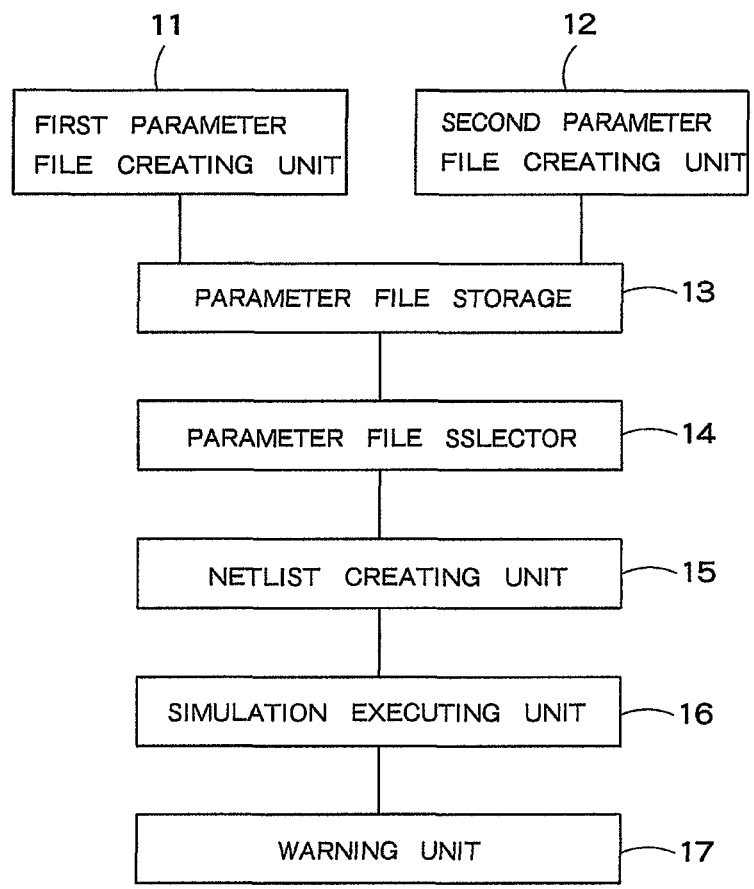
F I G. 3

NORMAL SIMULATION
```
section normal_sim
  model nmos bsim4
  +type = n
  ...
  inline subckt esd(p n)  ⎫
  cap p n 1p              ⎬ ESD PROTECTION ELEMENT
  ends esd                ⎭
endsection normal_sim
```
ESD SIMULATION
```
section ESD_sim
  model nmos level1
  +type = n
  ...
  inline subckt esd(p n)  ⎫
  D1 p 1 diode1           ⎪
  ...                     ⎬ ESD PROTECTION ELEMENT
  ends esd                ⎭
endsection ESD_sim
```
F I G. 4
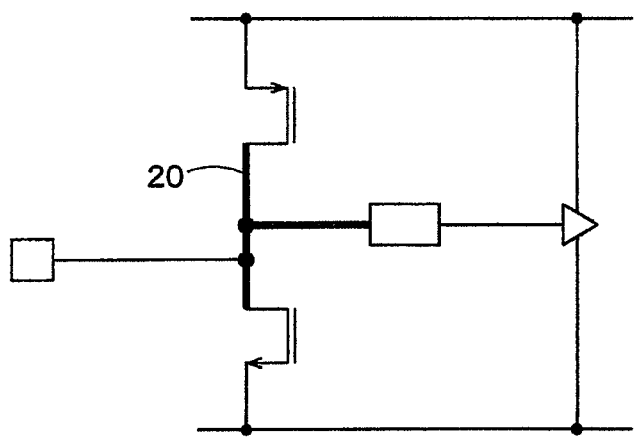
F I G. 5

SIMULATION DEVICE AND SIMULATION METHOD

CROSS REFERENCE TO RELATED APPLICATIONS

This application is based upon and claims the benefit of priority from the prior Japanese Patent Application No. 2011-207640, filed on Sep. 22, 2011, the entire contents of which are incorporated herein by reference.

FIELD

The present invention relates to a simulation device and a simulation method for verifying operation of a semiconductor circuit including an ESD (Electro Static Discharge) protection element.

BACKGROUND

Generally, an ESD protection element is arranged in an integrated circuit in order not that the elements and wiring in the integrated circuit are broken by instantaneous current flowing when the input/output pin of the integrated circuit touches a charged body such as a human body.

The ESD protection element has complicated current-voltage characteristics called snapback characteristics. Accordingly, it is not easy to imitate the operation of the ESD protection element in circuit simulation.

It is assumed to perform circuit simulation with respect to each of a plurality of regions obtained by dividing a characteristic line representing the snapback characteristics. In this case, however, it is difficult to improve the accuracy of operation verification since the boundary position between the regions becomes discontinuous and circuit simulation cannot be performed continuously.

BRIEF DESCRIPTION OF THE DRAWINGS

FIG. 1 is a circuit diagram showing an example of an equivalent circuit 1 of an ESD protection element.

FIG. 2 is a graph showing current-voltage characteristics of the equivalent circuit 1 of the ESD protection element in FIG. 1.

FIG. 3 is a block diagram showing a schematic structure of a simulation device 10 according to one embodiment of the present invention.

FIG. 4 is a diagram showing examples of parameter files stored in the parameter file storage 13.

FIG. 5 is a diagram showing an example of highlighting by a warning unit.

DETAILED DESCRIPTION

According to one aspect of one embodiment, a simulation device for verifying operation of a semiconductor circuit comprising an ESD (Electro Static Discharge) protection element has:

a first parameter file creating unit configured to create a parameter file for an equivalent circuit of the ESD protection element;

a second parameter file creating unit configured to create a parameter file for an internal circuit in the semiconductor circuit except for the ESD protection element;

a parameter file storage configured to store the parameter files created by the first and second parameter file creating units;

a parameter file selector configured to change a parameter file to be selected from the parameter files stored in the parameter file storage, depending on whether or not operation of the ESD protection element should be verified;

a netlist creating unit configured to create a netlist of the semiconductor circuit utilizing the parameter file selected by the parameter file selector; and a simulation executing unit configured to verify the operation of the semiconductor circuit based on the netlist.

The equivalent circuit of the ESD protection element for which the first parameter file creating unit creates the parameter file comprises:

first and second impedance elements configured to be connected in series between first and second reference voltage terminals; and a third impedance element, a rectifier element, and a transistor configured to be connected in series between the first and second reference voltage terminals, The transistor has a control terminal connected to a connection path between the first impedance element and the second impedance element, and The rectifier element is connected so that current flows from the first impedance element to the transistor through the third impedance element in a breakdown state.

Embodiments will now be explained with reference to the accompanying drawings.

Hereinafter, one embodiment of the present invention will be explained in detail. It is presumed that a simulation device according to the present embodiment verifies operation of a semiconductor circuit incorporating an ESD protection element. The ESD protection element is connected to at least one of an input pin, an output pin, and a power pin of the semiconductor circuit.

FIG. 1 is a circuit diagram showing an example of an equivalent circuit 1 of an ESD protection element. The equivalent circuit 1 of FIG. 1 has first and second impedance elements R1 and R2 and a rectifier element D1 connected in series between first and second reference voltage terminals Vdd and Vss, a third impedance element R3, a rectifier element D2, a transistor Q1, and a voltage source 2 connected in series between the first and second reference voltage terminals Vdd and Vss, and a rectifier element D3 connected between the first and second reference voltage terminals Vdd and Vss.

In the example explained below, resistance elements R1 to R3 are used as the first to third impedance elements R1 to R3 respectively, diodes D1 to D3 are used as the rectifier element D1 to D3 respectivel, and a bipolar transistor Q1 is used as the transistor Q1.

Further, in the equivalent circuit 1 of FIG. 1, a current source 3 is connected between the base and collector of the transistor Q1.

In the equivalent circuit 1 of FIG. 1, the diodes D1 and D3, the voltage source 2, and the current source 3 are not essential, but these components are arranged in the example explained below.

The anode of the diode D2 is connected to the collector of the transistor Q1, and the cathode of the diode D2 is connected to the resistance element R3. The emitter of the transistor Q1 is connected to the voltage source 2, and the base of the transistor Q1 is connected to a connection path n1 between the resistance elements R1 and R2.

The circuit configuration of the equivalent circuit 1 of FIG. 1 is simplified compared to a conventional equivalent circuit 1, and is characterized in that the element value of each circuit element in the equivalent circuit 1 can be easily determined. For example, in some conventional equivalent circuits, a diode is connected instead of the resistance element R1, but since it is not easy to determine the element value of the diode (such as breakdown voltage), much effort is required to determine the element value of each circuit element in the equivalent circuit. On the other hand, in the equivalent circuit 1 of the present embodiment, the resistance element R1 is connected instead of the diode, and thus the resistance value (i.e., element value) of the resistance element R1 can be easily determined through the following steps.

As stated above, the equivalent circuit 1 of FIG. 1 is characterized in not only that its circuit configuration is simple but also that the element value of each circuit element can be set simply. Further, the equivalent circuit 1 of FIG. 1 is excellent in the matching with snapback characteristics of the ESD protection element, as mentioned later.

FIG. 2 is a graph showing current-voltage characteristics of the equivalent circuit 1 of the ESD protection element in FIG. 1. In FIG. 2, the horizontal axis represents current flowing between the first and second reference voltage terminals Vdd and Vss, and the vertical axis represents voltage between the first and second reference voltage terminals Vdd and Vss.

As will be understood from FIG. 2, the graph of FIG. 2 has three linear regions LR1 to LR3. The linear region LR1 is a region where voltage V linearly increases as current I increases, and the linear region LR1 transits to the linear region LR2 when current exceeds It1. The linear region LR2, which shows snapback characteristics, is a region where the voltage V linearly decreases as the current I increases, and the linear region LR2 transits to the linear region LR3 when current exceeds Ih. The linear region LR3 is a region where the voltage V linearly increases as the current I increases.

In the linear region LR1, the current I from the first reference voltage terminal Vdd flows to the second reference voltage terminal Vss through the resistance elements R1 and R2, and no current flows through the transistor Q1. When the current I gradually increases and the voltage of the connection path between the resistance elements R1 and R2 exceeds the voltage between the base and emitter of the transistor Q1, the transistor Q1 is turned on and the linear region LR1 transits to the linear region LR2.

In the linear region LR2, the current I from the first reference voltage terminal Vdd flows through both of the path passing through the resistance elements R1 and R2 and the path passing through the collector and emitter of the transistor Q1. The transistor Q1 operates in an active region in order not that the voltage between the first and second reference voltage terminals Vdd and Vss increases when the current flowing between the collector and emitter of the transistor Q1 increases. The operation of the transistor Q1 is controlled by the current source 3.

When the current I flowing between the first and second reference voltage terminals Vdd and Vss reaches Ih, a breakdown is caused in the diode D2. Voltage Vh between the anode and cathode of the diode D2 at this time is breakdown voltage.

When the current I flowing between the first and second reference voltage terminals Vdd and Vss exceeds Ih, the transistor Q1 is completely turned on, and the linear region LR2 transits to the linear region LR3. In the linear region LR3, the current I from the first reference voltage terminal Vdd does not flow through the resistance elements R1 and R2, and flows through the path passing through the resistance element R3, the diode D2, the transistor Q1, and the voltage source 2.

As stated above, the equivalent circuit 1 of FIG. 1 corresponds to the current-voltage characteristics as shown in FIG. 2. By using the equivalent circuit 1 of FIG. 1, the accuracy of the matching with the current-voltage characteristics as shown in FIG. 2 can be improved. Further, in the present embodiment, since circuit simulation is continuously performed using the equivalent circuit 1 of FIG. 1 instead of being performed separately on each of a plurality of divided regions obtained by dividing the current-voltage characteristics as shown in FIG. 2, no discontinuous point is generated in the circuit simulation and calculation stability of the circuit simulation is improved.

FIG. 3 is a block diagram showing a schematic structure of a simulation device 10 according to one embodiment of the present invention. The simulation device 10 of FIG. 3 can verify the operation of various semiconductor circuits, and is particularly suitable for verifying the operation of a semiconductor circuit incorporating an ESD protection element having the equivalent circuit 1 as shown in FIG. 1.

The simulation device 10 of FIG. 3 has a first parameter file creating unit 11, a second parameter file creating unit 12, a parameter file storage 13, a parameter file selector 14, a netlist creating unit 15, and a simulation executing unit 16.

The first parameter file creating unit 11 creates a parameter file for the equivalent circuit 1 of the ESD protection element in the semiconductor circuit.

The second parameter file creating unit 12 creates a parameter file for each internal circuit in the semiconductor circuit except for the ESD protection element.

The parameter file storage 13 stores the parameter files created by the first and second parameter file creating units 12.

The parameter file selector 14 selects a part of the parameter files stored in the parameter file storage 13, depending on whether or not the operation of the ESD protection element should be verified.

The netlist creating unit 15 creates a netlist of the semiconductor circuit utilizing the parameter file selected by the parameter file selector 14.

The simulation executing unit 16 verifies the operation of the semiconductor circuit based on the netlist created by the netlist creating unit 15.

Here, a parameter file is a set of various parameters representing ideal characteristics of a target device of the circuit simulation, and more concretely, representing the type of each circuit element in the equivalent circuit 1 of the target device, the connection relationship between the circuit elements, the element value of each circuit element, etc. The element value of each circuit element includes dimension information of each circuit element. The dimension information makes it possible to perform optimizing operation for selecting an ESD protection element having the optimum dimension for the semiconductor circuit.

For example, the parameter file created by the first parameter file creating unit 11 includes parameters such as the element value of each circuit element in the equivalent circuit 1 of the ESD protection element.

More concretely, the resistance value of the resistance element R2 is obtained through the following steps.

The relationship between the current I and the voltage V in the linear region LR1 can be expressed by the following formula.

$$V=(R1+R2) \cdot I \quad (1)$$

The transistor Q1 is turned on when the voltage between its base and emitter becomes about 0.7 V at the boundary point between the linear regions LR1 and LR2. At this time, current shows It1. Accordingly, if disregarding the influence of the diode D1, the resistance value of the resistance element R2 can be expressed by the following Formula (2).

$$R2=0.7/It1 \quad (2)$$

Based on Formula (1) and Formula (2), the resistance value of the resistance element R1 can be expressed by the following Formula (3).

$$R1 = Vt1/It1 - R2 \quad (3)$$

Further, at the boundary point between the linear regions LR2 and LR3, current hardly flows between the base and emitter of the transistor Q1, and thus the voltage Vh at the boundary point between the linear regions LR2 and LR3 functions as the breakdown voltage of the diode D2.

Further, in the linear region LR3, current from the first reference voltage terminal Vdd does not flow through the resistance elements R1 and R2, and flows between the collector and emitter of the transistor Q1 from the resistance element R3 through the diode D2. Since the transistor Q1 operates in a saturation region, the resistance value of the resistance element R3 functions as on-resistance.

Further, the gain of the transistor Q1, forward-current gain, current gain, etc. are set as parameters based on experimental rules or trial and error.

Based on the above steps, the first parameter file creating unit 11 creates a parameter file for the equivalent circuit 1 of FIG. 1.

FIG. 4 is a diagram showing examples of parameter files stored in the parameter file storage 13. FIG. 4 shows examples of a parameter file for performing a normal simulation to verify the operation of each circuit element of a design target circuit in the semiconductor circuit except for the ESD protection element, and a parameter file for performing ESD simulation on the ESD protection element in the semiconductor circuit. The former parameter file is created by the first parameter file creating unit 11, and the latter parameter file is created by the second parameter file creating unit 12.

The two types of parameter files are arranged since there is no need to circumstantially verify the operation of each internal circuit in the semiconductor circuit except for the ESD protection element when verifying the operation of the ESD protection element, and there is no need to circumstantially verify the operation of the ESD protection element when circumstantially verifying the operation of each internal circuit in the semiconductor circuit except for the ESD protection element.

That is, when the ESD protection element is connected to the input/output terminal or power-supply terminal of the semiconductor circuit, capacity load of the terminal increases but it hardly influences the voltage level of the input/output terminal or power-supply terminal. Therefore, when performing the normal simulation, there is no need to perform circuit simulation considering the characteristics of the ESD protection element. On the other hand, when performing the ESD simulation, there is no need to perform circuit simulation considering the characteristics of each internal circuit in the semiconductor circuit except for the ESD protection element.

Accordingly, in the present embodiment, the parameter file is changed depending on which one of the normal simulation and the ESD simulation should be performed. That is, in the present embodiment, regardless of which one of the normal simulation and the ESD simulation should be performed, simulation is performed by changing the model (parameter file) for each circuit element in the semiconductor circuit without replacing circuit diagram data of the semiconductor circuit.

It is desirable to avoid the replacement of circuit diagram data as much as possible at the design stage of the semiconductor circuit, since it triggers a human error. In the present embodiment, since circuit diagram data is not replaced in both of the normal simulation and the ESD simulation, it is possible to speed up circuit simulation while preventing human errors in the circuit simulation.

Hereinafter, the simulation process in the present embodiment will be explained in more detail. In the ESD simulation, instantaneous current simulating an electrostatic discharge test is applied to a pin connected to the ESD protection element in order to check whether or not the electrostatic discharge protection element operates in a desired manner. To be considered at this time are the wiring path from the pin applied with the instantaneous current to the ESD protection element, and the influence on the power source line and ground line connected to the ESD protection element. Accordingly, when verifying the operation of the ESD protection element, it is desirable to perform simulation covering the path directly connected to the ESD protection element.

When more rigorous analysis is required or there may be a current path unexpectable for a circuit designer, it is necessary to consider the influence of each internal circuit leading to the pin connected to the ESD protection element, and another internal circuit sharing the power source line or ground line with the internal circuit. Thus, it is desirable to verify every internal circuit of the semiconductor circuit (full chip verification), but there is a fear that enormous time is required for the simulation since a great number of circuit elements and nodes should be analyzed in the full chip verification.

Accordingly, when performing the ESD simulation in the present embodiment, as a general rule, each internal circuit in the semiconductor circuit except for the ESD protection element is expressed using a simplified model (e.g., lebell) instead of a highly-accuracy model (e.g., bsim4 model) used in a normal circuit design.

This makes it possible to reduce the load of numerical analysis in the ESD simulation, and to analyze the ESD protection element at high speed.

Further, when performing the normal simulation, the ESD protection element is expressed by a simplified model, and each internal circuit other than the ESD protection element is expressed by a high-accuracy model.

The selection between the ESD simulation and the normal simulation may be realized by letting an operator select any one of two buttons displayed on a screen, for example. Alternatively, another selecting unit may be arranged.

Simulation results of the normal simulation and the ESD simulation are expressed analog values such as node voltage. Thus, when the maximum node voltage of a specific node of an analysis target is larger than a previously set value, a warning may be issued by highlighting the node on the screen as shown in FIG. 5, for example. In this case, a warning unit 17 is arranged in the simulation device FIG. 3. A concrete method of highlighting is not questioned, but the node may be displayed with a line 20 thicker than those for other nodes, or may be displayed with an eye-catching color such as red, for example. Further, a node voltage value may be displayed beside the node to invite circuit designer's attention thereto.

As stated above, in the present embodiment, the ESD simulation for verifying the operation of the ESD protection element in the semiconductor circuit can be selected separately from the normal simulation. When performing the ESD simulation, the operation of the ESD protection element is verified by creating a parameter file expressing the ESD protection element by a high-accuracy model while expressing each internal circuit in the semiconductor circuit except for the ESD protection element by a simplified model. Further, when performing the normal simulation, the operation of each internal circuit is verified by creating a parameter file expressing the ESD protection element by a simplified model while expressing each internal circuit in the semiconductor circuit except for the ESD protection element by a high-accuracy model. Accordingly, in the ESD simulation, the behavior of the ESD protection element can be analyzed in detail in a short time. Further, in the normal simulation, the behavior of each internal circuit can be analyzed in detail avoiding the influence of the ESD protection element.

As stated above, in the present embodiment, circuit simulation is performed by replacing the parameter file instead of diagram data, depending on whether the ESD simulation should be performed or the normal simulation should be performed, which makes it possible to perform a detailed analysis exclusively on the part whose operation should be verified. Accordingly, it is possible to considerably shorten the calculation time required for circuit simulation, and the operation of even a large-scale semiconductor circuit can be verified in a relatively short time.

Further, in the present embodiment, when creating a parameter file for the ESD simulation, the ESD protection element is expressed as a simplified equivalent circuit 1, which makes it possible to easily set the parameter of each circuit element in the equivalent circuit 1 and to shorten the time required for operation verification. Since snapback characteristics of the ESD protection element are considered when creating the equivalent circuit 1, accuracy of the matching with the snapback characteristics can be improved and no discontinuous point is generated in the circuit simulation, thereby calculation stability of the circuit simulation being improved.

Further, when creating a parameter file for the ESD simulation, the parameter of each circuit element is set considering the dimension (size) of the ESD protection element, which makes it possible to perform optimizing operation for selecting an ESD protection element having the optimum dimension for the semiconductor circuit.

Further, in the present embodiment, when a node where current or voltage exceeds a predetermined reference value is detected as a result of the ESD simulation or the normal simulation, a predetermined warning can be issued highlighting the node, as shown in FIG. 5, which makes it possible to detect abnormality in the semiconductor circuit simply and accurately, and to quickly recover the trouble.

At least a part of the simulation device 10 explained in the above embodiments may be formed of hardware or software. In the case of software, a program realizing at least a partial function of the simulation device 10 may be stored in a recording medium such as a flexible disc, CD-ROM, etc. to be read and executed by a computer. The recording medium is not limited to a removable medium such as a magnetic disk, optical disk, etc., and may be a fixed-type recording medium such as a hard disk device, memory, etc.

Further, a program realizing at least a partial function of the simulation device 10 can be distributed through a communication line (including radio communication) such as the Internet. Furthermore, this program may be encrypted, modulated, and compressed to be distributed through a wired line or a radio link such as the Internet or through a recording medium storing it therein.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A simulation device for verifying operation of a semiconductor circuit comprising an ESD (Electro Static Discharge) protection element, comprising:
   a first parameter file creating unit configured to create a parameter file for an equivalent circuit of the ESD protection element;
   a second parameter file creating unit configured to create a parameter file for an internal circuit in the semiconductor circuit except for the ESD protection element;
   a parameter file storage configured to store the parameter files created by the first and second parameter file creating units;
   a parameter file selector configured to select one parameter file from the parameter files stored in the parameter file storage, depending on whether or not operation of the ESD protection element should be verified;
   a netlist creating unit configured to create a netlist of the semiconductor circuit utilizing the parameter file selected by the parameter file selector; and
   a simulation executing unit configured to verify the operation of the semiconductor circuit based on the netlist,
   wherein the equivalent circuit of the ESD protection element for which the first parameter file creating unit creates the parameter file comprises:
   first and second impedance elements configured to be connected in series between first and second reference voltage terminals; and
   a third impedance element, a rectifier element, and a transistor configured to be connected in series between the first and second reference voltage terminals,
   the transistor comprising a control terminal connected to a connection path between the first impedance element and the second impedance element, and
   the rectifier element being connected so that current flows from the first impedance element to the transistor through the third impedance element in a breakdown state,
   wherein the first parameter file creating unit creates a parameter file for a detailed model based on the equivalent circuit of the ESD protection element when verifying the operation of the ESD protection element, and creates a parameter file for a simplified model of the ESD protection element when verifying the operation of the internal circuit in the semiconductor circuit except for the ESD protection element, and
   the second parameter file creating unit creates a parameter file for a simplified model of the internal circuit when verifying the operation of the ESD protection element, and creates a parameter file for a detailed model of the internal circuit when verifying the operation of the internal circuit.

2. The simulation device of claim 1,
   wherein the parameter file selector changes a parameter file to be selected from the parameter files stored in the parameter file storage, depending on whether the operation of the ESD protection element should be verified or the operation of the internal circuit in the semiconductor circuit except for the ESD protection element should be verified.

3. The simulation device of claim 1,
   wherein the first parameter file creating unit creates a parameter file including a circuit configuration of the equivalent circuit of the ESD protection element, a type of each circuit element in the equivalent circuit, and an element value of each circuit element.

4. The simulation device of claim 1, further comprising:
a warning unit configured to issue a predetermined warning when a node where a current value or a voltage value exceeds a predetermined reference value is detected through the operation verification by the simulation executing unit.

5. The simulation device of claim 1,
wherein the ESD protection element is connected to at least one of an input pin, an output pin, and a power pin of the semiconductor circuit.

6. The simulation device of claim 1,
wherein the equivalent circuit of the ESD protection element comprises:
a voltage source configured to be connected between the transistor and the second reference voltage terminal; and
a current source configured to be connected between the control terminal of the transistor and the rectifier element.

7. The simulation device of claim 6,
wherein the rectifier element comprises an anode terminal connected to the current source, and a cathode terminal connected to the third impedance element.

8. The simulation device of claim 1,
wherein the equivalent circuit of the ESD protection element comprises a current-voltage characteristics based on first to third linear regions continuously connected,
the first linear region being a region where voltage linearly increases as current increases,
the second linear region being a region where voltage linearly decreases as current increases, and
the third linear region being a region where voltage linearly increases as current increases.

9. The simulation device of claim 8,
wherein when current flowing between the first and second reference voltage terminals reaches a predetermined threshold value, a breakdown is caused in the rectifier element and transition from the second linear region to the third linear region is achieved.

10. A simulation method for verifying operation of a semiconductor circuit comprising an ESD (Electro Static Discharge) protection element, the simulation method being executed by a computer, the method comprising:
creating a first parameter file for an equivalent circuit of the ESD protection element;
creating a second parameter file for an internal circuit in the ESD protection element except for the semiconductor circuit;
storing the first and second parameter files in a parameter file storage;
selecting one parameter file from the parameter files stored in the parameter file storage, depending on whether or not operation of the ESD protection element should be verified;
creating a netlist of the semiconductor circuit utilizing the selected parameter file; and
verifying the operation of the semiconductor circuit based on the netlist,
wherein the equivalent circuit of the ESD protection element for which the parameter file is created comprises:
first and second impedance elements configured to be connected in series between first and second reference voltage terminals; and
a third impedance element, a rectifier element, and a transistor configured to be connected in series between the first and second reference voltage terminals, the transistor comprising a control terminal connected to a connection path between the first impedance element and the second impedance element, and
the rectifier element being connected so that current flows from the first impedance element to the transistor through the third impedance element in a breakdown state,
wherein in the step of creating a parameter file for an equivalent circuit of the ESD protection element, a parameter file for a detailed model based on the equivalent circuit of the ESD protection element is created when verifying the operation of the ESD protection element, and a parameter file for a simplified model of the ESD protection element is created when verifying the operation of the internal circuit in the semiconductor circuit except for the ESD protection element, and
in the step of creating a parameter file for an internal circuit in the ESD protection element except for the semiconductor circuit, a parameter file for a simplified model of the internal circuit is created when verifying the operation of the ESD protection element, and a parameter file for a detailed model of the internal circuit is created when verifying the operation of the internal circuit.

11. The simulation method of claim 10,
wherein in the step of changing a parameter file to be selected, a parameter file to be selected from the parameter files stored in the parameter file storage is changed depending on whether the operation of the ESD protection element should be verified or the operation of the internal circuit in the semiconductor circuit except for the ESD protection element should be verified.

12. The simulation method of claim 10,
wherein in the step of creating a parameter file, a parameter file including a circuit configuration of the equivalent circuit of the ESD protection element, a type of each circuit element in the equivalent circuit, and an element value of each circuit element is created.

13. The simulation method of claim 10, further comprising:
a step of issuing a predetermined warning when a node where a current value or a voltage value exceeds a predetermined reference value is detected through the operation verification by the simulation executing unit.

14. The simulation method of claim 10,
wherein the ESD protection element is connected to at least one of an input pin, an output pin, and a power pin of the semiconductor circuit.

15. The simulation method of claim 10,
wherein the equivalent circuit of the ESD protection element comprises:
a voltage source configured to be connected between the transistor and the second reference voltage terminal; and
a current source configured to be connected between the control terminal of the transistor and the rectifier element.

16. The simulation method of claim 15,
wherein the rectifier element comprises an anode terminal connected to the current source, and a cathode terminal connected to the third impedance element.

17. The simulation method of claim 10,
wherein the equivalent circuit of the ESD protection element comprises a current-voltage characteristics based on first to third linear regions continuously connected,
the first linear region being a region where voltage linearly increases as current increases,
the second linear region being a region where voltage linearly decreases as current increases, and the third linear region being a region where voltage linearly increases as current increases.

18. The simulation method of claim 17,
wherein when current flowing between the first and second reference voltage terminals reaches a predetermined threshold value, a breakdown is caused in the rectifier element and transition from the second linear region to the third linear region is achieved.

* * * * *